(12) United States Patent
Arvin et al.

(10) Patent No.: US 8,298,930 B2
(45) Date of Patent: Oct. 30, 2012

(54) UNDERCUT-REPAIR OF BARRIER LAYER METALLURGY FOR SOLDER BUMPS AND METHODS THEREOF

(75) Inventors: Charles L. Arvin, Poughkeepsie, NY (US); Timothy H. Daubenspeck, Colchester, VT (US); Jeffrey P. Gambino, Westford, VT (US); Christopher D. Muzzy, Burlington, VT (US); Wolfgang Sauter, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/959,697

(22) Filed: Dec. 3, 2010

(65) Prior Publication Data

US 2012/0139113 A1   Jun. 7, 2012

(51) Int. Cl.
*H01L 23/488* (2006.01)

(52) U.S. Cl. . 438/614; 257/751; 257/764; 257/E23.015; 257/E23.02

(58) Field of Classification Search .......... None
See application file for complete search history.

(56) References Cited

U.S. PATENT DOCUMENTS

| | | | |
|---|---|---|---|
| 5,118,382 A | 6/1992 | Cronin et al. | |
| 7,176,583 B2 | 2/2007 | Daubenspeck et al. | |
| 7,541,272 B2 | 6/2009 | Daubenspeck et al. | |
| 7,825,511 B2 | 11/2010 | Daubenspeck et al. | |
| 2002/0185733 A1* | 12/2002 | Chow et al. | 257/737 |
| 2004/0266161 A1* | 12/2004 | Horng | 438/613 |
| 2006/0076677 A1 | 4/2006 | Daubenspeck et al. | |
| 2007/0087544 A1* | 4/2007 | Chang et al. | 438/612 |
| 2007/0117368 A1* | 5/2007 | Tsai et al. | 438/612 |
| 2008/0050905 A1* | 2/2008 | Uchida et al. | 438/614 |
| 2008/0157362 A1 | 7/2008 | Chang et al. | |
| 2008/0194095 A1* | 8/2008 | Daubenspeck et al. | 438/612 |
| 2009/0127710 A1 | 5/2009 | Daubenspeck et al. | |
| 2009/0163019 A1 | 6/2009 | Srivastava et al. | |
| 2009/0218230 A1 | 9/2009 | Iijima | |
| 2010/0032835 A1 | 2/2010 | Daubenspeck et al. | |
| 2010/0065965 A1 | 3/2010 | Daubenspeck et al. | |
| 2010/0167522 A1 | 7/2010 | Daubenspeck et al. | |

FOREIGN PATENT DOCUMENTS

| | | |
|---|---|---|
| JP | 2008028112 | 2/2008 |
| JP | 2009206334 | 9/2009 |

* cited by examiner

*Primary Examiner* — Matthew W Such
*Assistant Examiner* — Abul Kalam
(74) *Attorney, Agent, or Firm* — David Cain; Roberts Mlotkowski Safran & Cole, P.C.

(57) ABSTRACT

A method of making a semiconductor structure includes patterning a barrier layer metallurgy (BLM) which forms an undercut beneath a solder material, and forming a repair material in the undercut and on the solder material. The method also includes removing the repair material from the solder material, and reflowing the solder material.

19 Claims, 5 Drawing Sheets

UNDERCUT-REPAIR OF BARRIER LAYER METALLURGY FOR SOLDER BUMPS AND METHODS THEREOF

FIELD OF THE INVENTION

The invention relates to semiconductor structures and methods of manufacture and, more particularly, to structures and methods for undercut-repair of the barrier layer metallurgy (BLM) for solder bumps.

BACKGROUND

Lead-free solder bump structures may be formed either by electroplating or by a physical transfer methodology, such as C4 (controlled collapse chip connection) and C4NP (controlled collapse chip connection new process). For lead-free (Pb-free) solder, the BLM (barrier layer metallurgy or ball limiting metallurgy) may comprise layers of titanium-tungsten, (TiW), copper (Cu), and nickel (Ni). The BLM may alternatively comprise layers of TiW, Cu, Ni, and Cu. During patterning of the bottom Cu seed layer and the TiW base layer, a chemical undercut of 1-2 µm per edge results. In addition, once the lead-free solder bump is placed or electroplated, there is a thermally driven reaction that occurs between tin (Sn) in the bump and any exposed Cu seed layer edge. The reaction consumes Cu in the formation of an intermetallic compound and results in additional undercut of the Cu beneath the solder bump. This is referred to as thermal undercut, and can add an additional 2-5 µm per edge of bump undercut. The sum of the two undercut mechanisms in C4NP or plated C4 processing is typically on the order of 4-5 µm per edge, with a wide range (e.g., 4-5 additional microns) extending the worst-case maximum possible bump undercut into the 5-10 µm range per edge.

Bump undercuts pose a chip reliability concern for white bumps (e.g., C4 solder bumps that do not make good electrical contact to the last metal pad), particularly on the tensile side of the bump in the case of FCPBGA (flip chip ball grid array) organic laminate packaging. On the tensile side of the bump, the BLM undercut can act as an incipient crack when bump torque is applied during thermal coefficient of expansion (TCE)-mismatch cooling at the chip join operation. This crack can allow the bump to rotate and crack the underlying back end of line (BEOL) dielectric and wiring materials.

Accordingly, there exists a need in the art to overcome the deficiencies and limitations described hereinabove.

SUMMARY

In a first aspect of the invention, there is a method of making a semiconductor structure. The method includes patterning a barrier layer metallurgy (BLM) which forms an undercut beneath a solder material, and forming a repair material in the undercut and on the solder material. The method also includes removing the repair material from the solder material, and reflowing the solder material.

In another aspect of the invention, there is a method of forming a semiconductor structure comprising: forming a barrier layer metallurgy (BLM) contacting a bond pad in a chip; forming a solder bump on the BLM; and patterning the BLM. The patterning forms an undercut at an edge of the solder bump. The method also includes conformally depositing a repair material on the BLM and the solder bump. The depositing substantially fills the undercut with the repair material. The method also comprises patterning the repair material to remove the repair material from a surface of the solder bump while leaving the repair material in the undercut, and reflowing the solder bump to form a solder ball.

In another aspect of the invention, there is a semiconductor structure comprising a barrier layer metallurgy (BLM) formed in a final via and contacting a bond pad in a chip, and a solder material on the BLM. An edge of the BLM is recessed laterally inward relative to an edge of the solder material. The structure also comprises a repair material filling a region between the edge of the BLM and the edge of the solder material.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an undercut-repair of a BLM of a solder bump, which comprises the structures of the present invention. In still further embodiments, a method in a computer-aided design system is provided for generating a functional design model of the undercut-repair of a BLM of a solder bump. The method comprises generating a functional representation of the structural elements of the undercut-repair of a BLM of a solder bump.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to structures and methods for undercut-repair of the barrier layer metallurgy (BLM) for solder bumps. In accordance with aspects of the invention, the BLM undercut is repaired by depositing a material (e.g., a repair material) in the undercut after the BLM patterning and before the solder reflow. Implementations also include etching back of the repair material to remove the repair material from the surface of the solder, while leaving the repair material in the undercut. In embodiments, the repair material is either non-reactive with the solder or has a relatively slow reaction rate with solder. In this manner, volumetric expansion of the material within the undercut is avoided, which beneficially reduces the likelihood of cracking.

Figure 1:
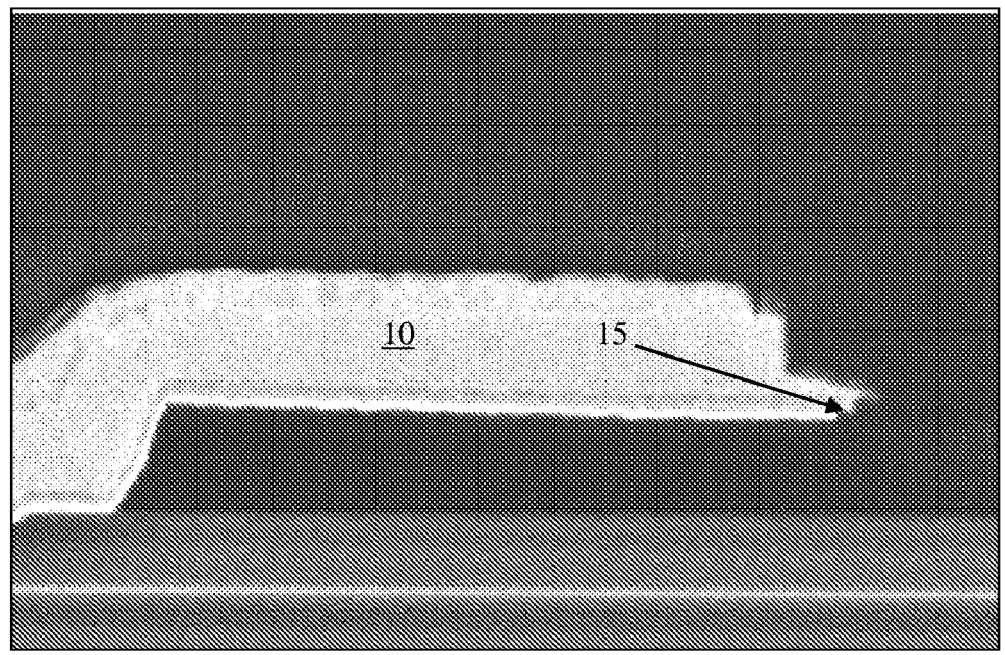
FIGS. 1 and 2 show images of undercuts of a BLM in a solder bump structure.
Figure 2:
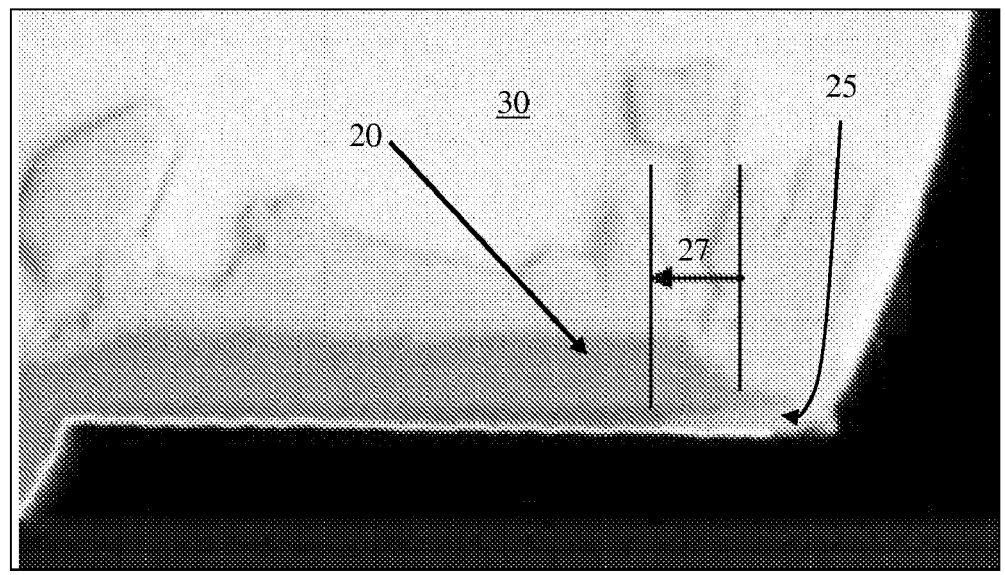

FIGS. 1 and 2 show images of undercuts of a BLM in a solder bump structure. In particular, FIG. 1 shows an edge of a BLM 10 including an undercut 15. FIG. 2 shows an edge of a BLM 20 including an undercut 25 having an undercut dimension 27. Still referring to FIG. 2, solder from solder bump 30 has flowed under the undercut and reacted with the copper of the BLM 20, thereby causing a volumetric expansion under the undercut and pushing the edge of the BLM 20 upward.

Figure 3:
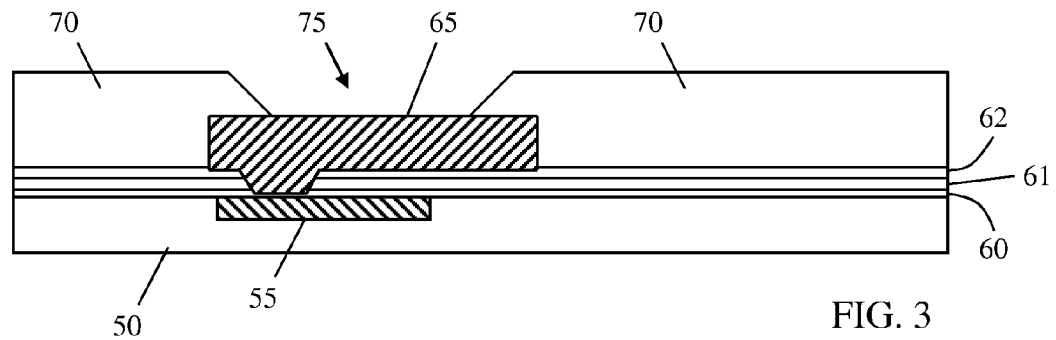
FIGS. 3-11 depict semiconductor structures and processing steps associated with aspects of the invention.

FIGS. 3-11 show structures and processing steps in accordance with aspects of the invention. In particular, FIG. 3 shows a portion of a semiconductor wafer comprising an insulator layer 50, a metallization 55 formed in the insulator layer 50, capping layers 60, 61, 62 formed on the insulator layer 50, a bond pad 65, and a final passivation layer 70. The structures shown in FIG. 3 may be formed using conventional semiconductor fabrication processes and materials. For example, the insulator layer 50 may comprise an upper level (e.g., last level) wiring layer of an integrated circuit chip and may be composed of $SiO_2$, FSG (fluorine-doped silicon oxide), or any other suitable electrical insulator material. The metallization 55 may comprise, for example, a wire and may be composed of copper, copper alloy, aluminum, or any other desired electrically conductive material. The capping layers 60 and 62 may be composed of, for example, SiN, and the capping layer 61 may be composed of, for example, $SiO_2$. The bond pad 65 may be composed of, for example, aluminum, and the passivation layer 70 may be composed of, for example, photosensitive polyimide (PSPI).

In embodiments, a final via 75 is formed in the passivation layer 70 to expose an upper surface of the bond pad 65. The final via 75 may be formed using conventional techniques, such as by exposing and developing the PSPI using a predefined pattern of light. The final via 75 and bond pad 65 constitute a location for a solder bump.

Figure 4:
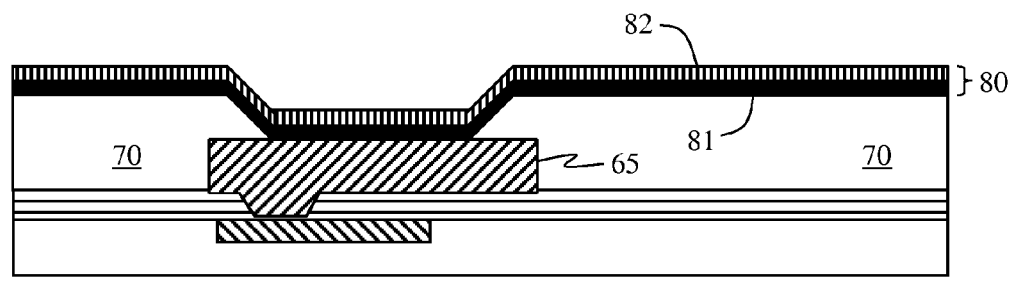

As depicted in FIG. 4, a BLM 80 is formed on the exposed surfaces of the wafer. The BLM 80 may be formed using standard semiconductor fabrication processes and materials. In embodiments, the BLM 80 may comprise a first layer 81 composed of TiW (titanium-tungsten) that is deposited (e.g., via physical vapor deposition (PVD) sputtering) on the exposed upper surfaces of the bond pad 65 and passivation layer 70. The BLM 80 may also comprise a second layer 82 comprising layers of Ni/Cu (nickel/copper) or Cu/Ni/Cu (copper/nickel/copper) formed on the first layer 81 by electroplating. The invention is not limited to this particular exemplary configuration of BLM, however, and any suitable BLM configuration may be used within the scope of the invention. For example, one of the copper layers of the second layer 82 may comprise a chromium-copper (Cr—Cu) alloy.

Figure 5:
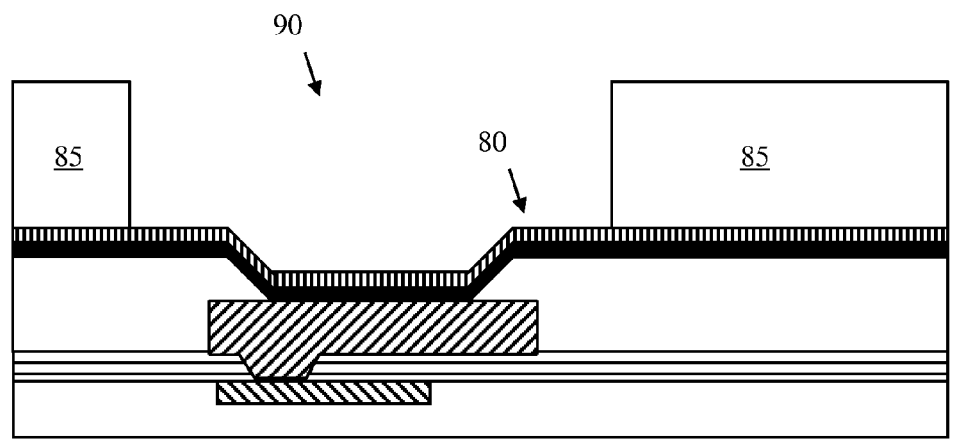
Figure 6:
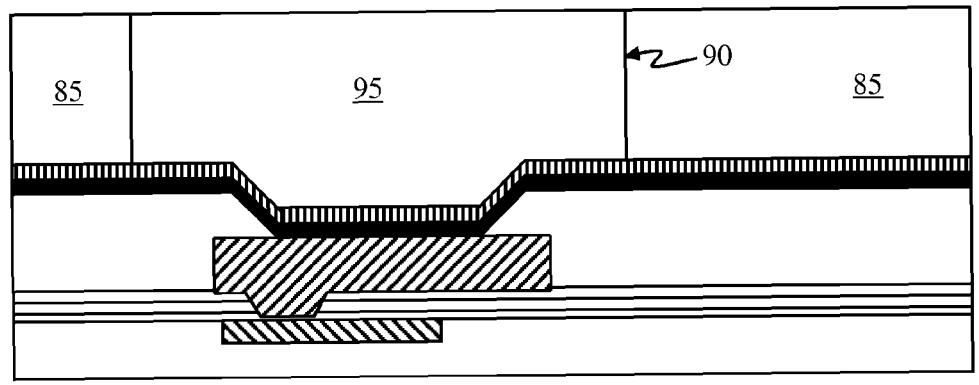
Figure 7:
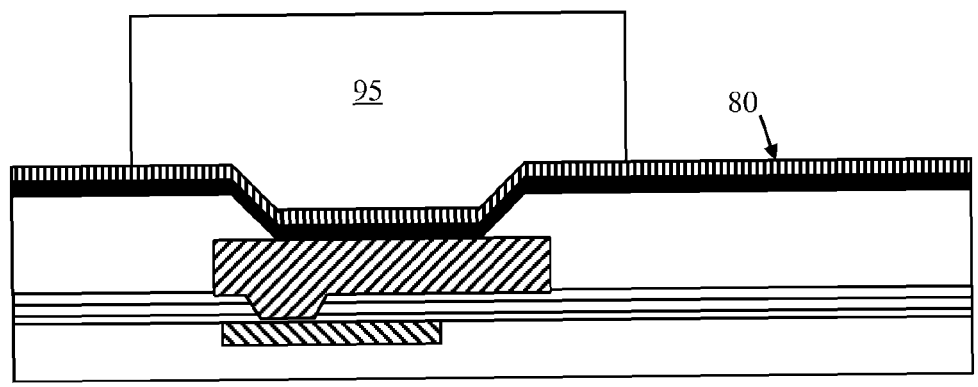

As shown in FIG. 5, a layer of photoresist material 85 is formed on the BLM 80, developed, and exposed to define an opening 90 where a solder bump will be formed. The opening 90 is aligned with the final via. As depicted in FIG. 6, a solder bump comprising solder material 95 is formed in the opening 90 defined by the photoresist material 85. The solder material 95 may be formed using conventional techniques, such as electroplating. The solder material 95 may comprise any suitable material(s), such as Pb-free (e.g., Sn-based) solder. As depicted in FIG. 7, the photoresist material 85 is stripped from the BLM 80 using any suitable conventional techniques, such as an HF stripping process.

Figure 8:
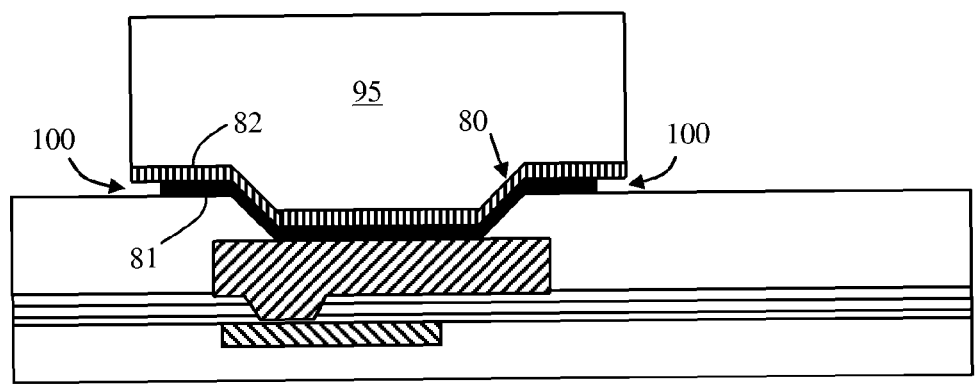

Removal of the photoresist material 85 exposes portions of the BLM 80 on the wafer. Accordingly, as depicted in FIG. 8, the BLM 80 is etched to the edge of the solder material 95. The BLM 80 may be etched using any desired etch process. For example, a two step etch may be employed that includes an electroetching process to remove portions of the second layer 82 (e.g., Ni/Cu or Cu/Ni/Cu) and a wet etch process (e.g., an $H_2O_2$ based wet etch) to remove portions of the first layer 81 (e.g., TiW). The BLM etching forms an undercut 100 under edges of the solder material 95, e.g., an edge of the BLM 80 is recessed laterally inward relative to an edge of the solder material 95. In particular, the TiW first layer 81 may be over-etched resulting in the undercut 100.

Figure 9:
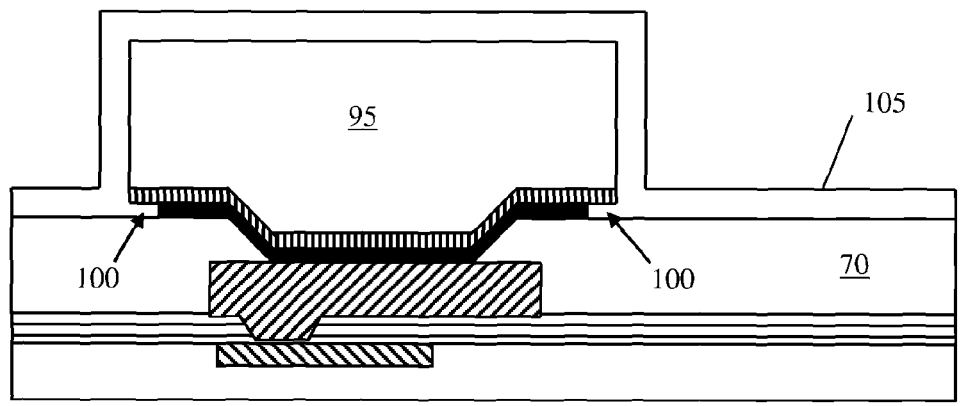

As shown in FIG. 9, and in accordance with aspects of the invention, after etching the BLM 80 and prior to reflowing the solder material 95, a layer of repair material 105 is formed on the wafer including in the undercut 100. In embodiments, the repair material 105 comprises material that is non-reactive with the solder material 95 or has a slow reaction rate with the solder material 95. For example, the repair material 105 may comprise, but is not limited to: gamma-aminopropyltriethoxysilane, $SiO_2$, hexamethyldisilazane (HMDS), or Ni. In embodiments, a spin-on process may be used to apply polymer-based repair material 105 (e.g., gamma-aminopropyltriethoxysilane, HDMS, etc.). In further embodiments, a conformal deposition process (e.g., chemical vapor deposition (CVD)) may be used to deposit a repair material 105 comprising $SiO_2$ or Ni. The invention is not limited to the materials and formation processes described herein, and other suitable materials and fabrication process may be used to form the layer of repair material 105 provided that the repair material 105 substantially fills the undercut 100 and is substantially non-reactive with, or only slowly reactive with, the solder material 95.

Figure 10:
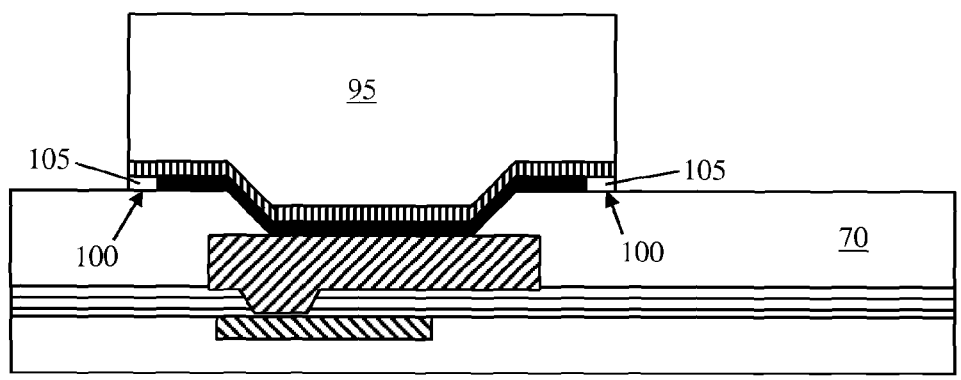

As depicted in FIG. 10, the repair material 105 is patterned to remove exposed portions of the repair material 105 from the solder material 95 and the passivation layer 70. In embodiments, an isotropic reactive ion etch (RIE) is used to etch the repair material 105. The solder material 95 masks the repair material 105 in the undercut 100 during the etching. In this manner, exposed repair material 105 is removed from the surface of the solder material 95, while a portion of the repair material 105 is left filling the undercut 100. The invention is not limited to an RIE removal process, and any suitable process may be used to pattern the repair material 105.

Figure 11:
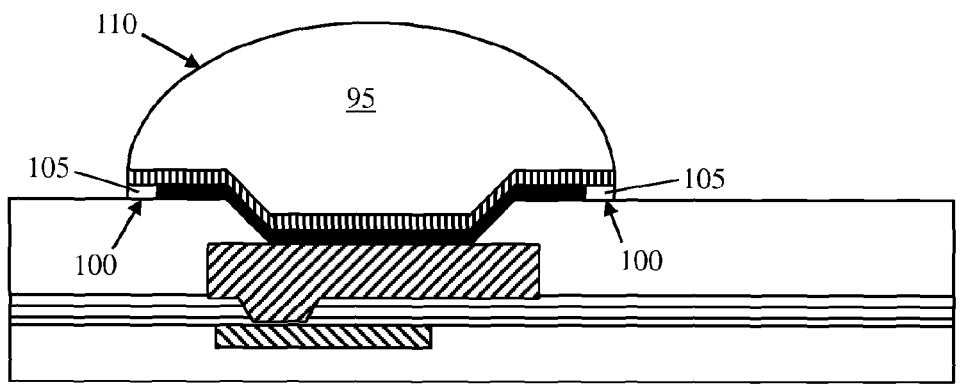

As shown in FIG. 11, the solder material 95 is reflowed to form a solder ball 110. The repair material 105 prevents solder material 95 from flowing into the undercut 100. In this manner, the repair material 105 substantially prevents a thermal undercut of the BLM by preventing the tin-based solder material 95 from entering the undercut 100 and reacting with the copper-based BLM 80 during the reflowing Accordingly, implementations of the invention repair (e.g., fill) the chemical undercut (e.g., undercut 100) and substantially prevent additional thermal undercut. This, in turn, reduces stresses and the likelihood of cracking.

Figure 12:
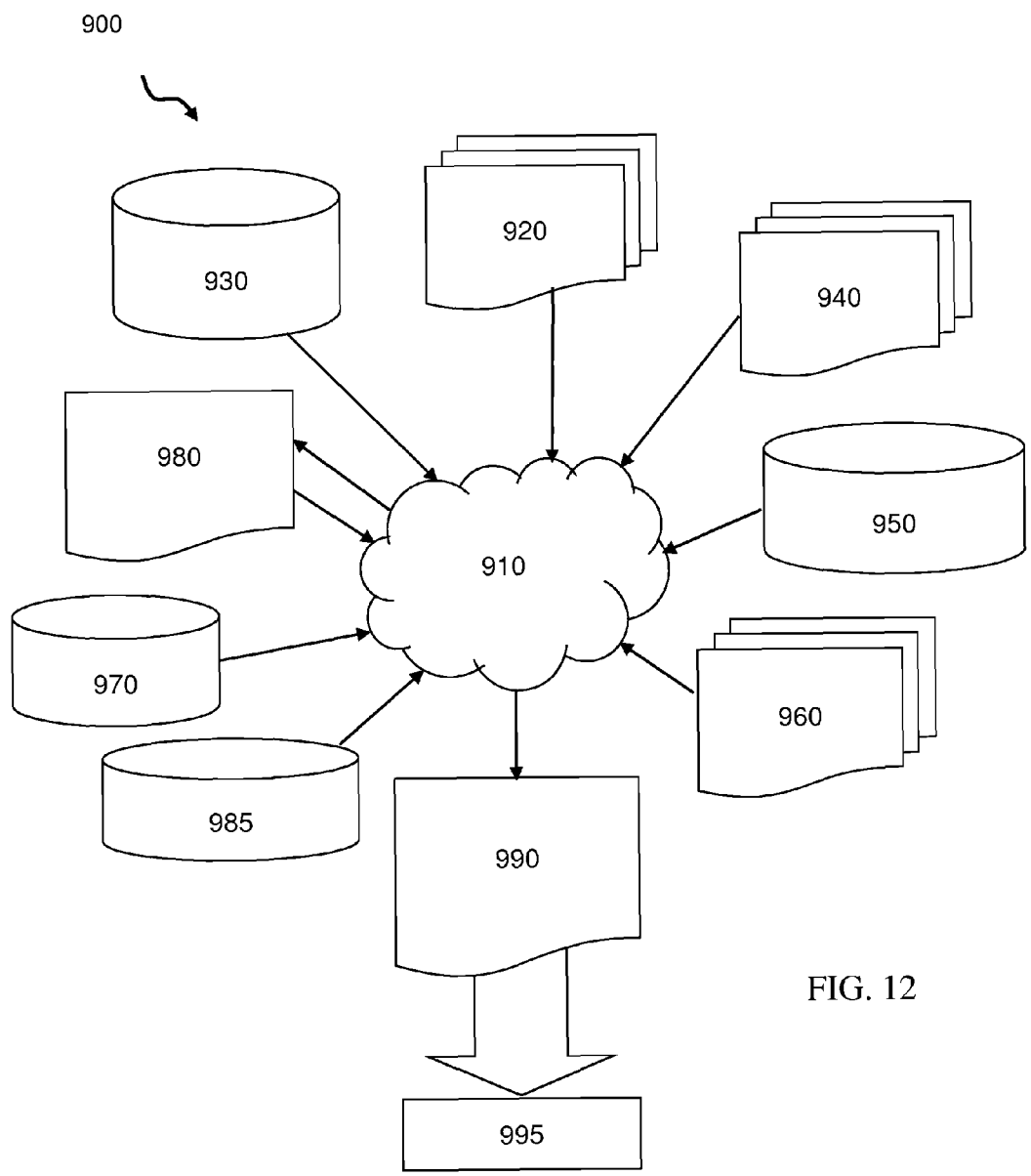
FIG. 12 is a flow diagram of a design process used in semiconductor design, manufacture, and/or test.

FIG. 12 is a flow diagram of a design process used in semiconductor design, manufacture, and/or test. FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 3-11. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3-11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-11. In one embodiment, design structure 990 may comprise a compiled, executable HDL simulation model that functionally simulates the devices shown in FIGS. 3-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3-11. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of making a semiconductor structure, comprising:
    forming an upper level wiring layer composed of an electrical insulator material;
    forming a wire in the upper level wiring layer;
    forming a plurality of capping layers on the wire and the upper level wiring layer;
    forming a passivation layer on the plurality of capping layers;
    forming a first barrier layer metallurgy (BLM) layer on and contacting a bond pad in a chip, wherein the bond pad is formed in the passivation layer, over the wire, and extending through the plurality of capping layers toward the wire;
    forming a second BLM layer on and contacting the first BLM layer;
    forming a solder material on and contacting the second BLM layer, wherein the first and second BLM layers extend laterally outward relative to side edges of the solder material;
    removing portions of the second BLM layer such that the second BLM layer is aligned with the side edges of the solder material;
    patterning the first BLM layer, wherein the patterning forms an undercut beneath the solder material;
    forming a repair material in the undercut and on the solder material;
    removing the repair material from the solder material; and
    reflowing the solder material.

2. The method of claim 1, wherein the repair material prevents the solder material from entering the undercut during the reflowing.

3. The method of claim 1, wherein the removing the repair material comprises etching the repair material using a reactive ion etch with the solder material masking a portion of the repair material during the etching, wherein the etching removes a first portion of the repair material from a surface of the solder material while leaving a second portion the repair material in the undercut.

4. The method of claim 1, wherein the repair material is substantially non-reactive with the solder material.

5. The method of claim 1, wherein:
    the repair material comprises a polymer; and
    the depositing the repair material comprises applying the polymer in a spin-on process.

6. The method of claim 5, wherein the polymer comprises one of gamma-aminopropyltriethoxysilane and hexamethyldisilazane.

7. The method of claim 1, wherein:
    the repair material comprises $SiO_2$ or Ni; and
    the depositing the repair material comprises conformally depositing the $SiO_2$ or Ni using chemical vapor deposition.

8. The method of claim 1, wherein the depositing the repair material and the patterning the repair material are performed after the patterning the first BLM layer.

9. The method of claim 8, wherein the depositing the repair material and the patterning the repair material are performed before the reflowing the solder material.

10. The method of claim 1, wherein:
    the solder material is a substantially lead-free solder material; and
    the second BLM layer comprises copper.

11. A method of forming a semiconductor structure, comprising:
    forming an upper level wiring layer composed of an electrical insulator material;
    forming a wire in the upper level wiring layer;
    forming a plurality of capping layers on the wire and the upper level wiring layer;
    forming a passivation layer on the plurality of capping layers;
    forming a final via in the passivation layer to expose an upper surface of a bond pad, wherein the bond pad is formed in the passivation layer, over the wire, and extending through the plurality of capping layers toward the wire;
    forming a first barrier layer metallurgy (BLM) layer on and contacting the upper surface of the bond pad in a chip;
    forming a second BLM layer on the first BLM layer;
    forming a photoresist on an upper surface of the second BLM layer, wherein the photoresist has an opening over the final via and the photoresist is formed after the second BLM layer;
    forming a solder bump on and contacting the upper surface of the second BLM layer and within the opening of the photoresist;
    patterning the first and second BLM layers, wherein the patterning forms an undercut at an edge of the solder bump by over-etching the first BLM layer, and wherein the patterning etches the second BLM layer to an edge of the solder bump;

conformally depositing a repair material on the first and second BLM layers and the solder bump, wherein the depositing substantially fills the undercut with the repair material;

patterning the repair material to remove the repair material from a surface of the solder bump while leaving the repair material in the undercut; and reflowing the solder bump to form a solder ball.

12. The method of claim 11, wherein:

the forming the second BLM layer comprises forming at least one layer comprising copper;

the solder bump comprises tin; and the patterning the first and second BLM layers comprises an electroetching process that removes portions of the second BLM layer and a wet etch process that removes portions of the first BLM layer.

13. The method of claim 12, wherein the repair material substantially prevents a thermal undercut of the second BLM layer by preventing the tin from entering the undercut and reacting with the copper during the reflowing.

14. The method of claim 13, wherein the repair material is substantially non-reactive with the tin.

15. The method of claim 14, wherein:

the repair material comprises a polymer; and the depositing the repair material comprises applying the polymer using a spin-on process.

16. The method of claim 15, wherein the depositing the repair material and the patterning the repair material are performed after the patterning the first and second BLM layers.

17. The method of claim 16, wherein the depositing the repair material and the patterning the repair material are performed before the reflowing the solder bump.

18. A semiconductor structure, comprising:

a barrier layer metallurgy (BLM) formed in a final via and contacting a bond pad in a chip;

a solder material on the BLM, wherein an edge of the BLM is recessed laterally inward relative to an edge of the solder material;

a repair material filling a region between the edge of the BLM and the edge of the solder material;

an upper level wiring layer composed of an electrical insulator material;

a wire formed in the upper level wiring layer;

a plurality of capping layers formed on the wire and the upper level wiring layer; and a passivation layer formed on the plurality of capping layers, wherein the bond pad is formed in the passivation layer, over the wire, and extending through the plurality of capping layers toward the wire;

the BLM comprises at least one copper-containing layer and at least one TiW-containing layer;

the solder material comprises tin; and the repair material is substantially non-reactive with the tin and comprises one of: gamma-aminopropyltriethoxysilane, hexamethyldisilazane, Ni, and $SiO_2$.

19. The structure of claim 18, wherein the repair material substantially prevents a thermal undercut of the BLM.

* * * * *